United States Patent
Ku

(10) Patent No.: US 7,795,628 B2
(45) Date of Patent: Sep. 14, 2010

(54) LED ASSEMBLY WITH SEPARATED THERMAL AND ELECTRICAL STRUCTURES THEREOF

(75) Inventor: Chin-Long Ku, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 262 days.

(21) Appl. No.: 12/110,346

(22) Filed: Apr. 27, 2008

(65) Prior Publication Data

US 2009/0236616 A1    Sep. 24, 2009

(30) Foreign Application Priority Data

Mar. 19, 2008   (CN) .................. 2008 1 0066120

(51) Int. Cl.
    *H01L 29/18* (2006.01)
(52) U.S. Cl. .................. 257/88; 257/81; 257/95; 257/99; 257/E33.056; 257/E33.058; 257/E25.032
(58) Field of Classification Search ............. 257/79–82, 257/88, 91, 98, 100, 116, 117, 432–437, 257/749, E33.056–E33.059, E25.032; 438/25–28, 438/FOR. 417
    See application file for complete search history.

(56) References Cited

U.S. PATENT DOCUMENTS

| 5,534,718 | A  | * | 7/1996 | Chang ................... 257/98 |
| 6,561,680 | B1 |   | 5/2003 | Shih |
| 7,224,047 | B2 | * | 5/2007 | Carberry et al. ........... 257/676 |
| 7,429,790 | B2 | * | 9/2008 | Condie et al. ............ 257/709 |
| 7,642,704 | B2 | * | 1/2010 | Imai et al. .............. 313/483 |
| 2006/0138645 | A1 |  | 6/2006 | Ng et al. |

* cited by examiner

*Primary Examiner*—Jasmine J Clark
(74) *Attorney, Agent, or Firm*—Frank R. Niranjan

(57) ABSTRACT

An LED assembly includes a substrate and a plurality of LEDs mounted on the substrate. Each LED comprises an LED die, a base supporting the LED die thereon and thermally contacting the substrate to take heat generated by the LED die to the substrate, a pair of leads electrically connecting the LED die to input a current to the LED die, and an encapsulant enveloping the LED die. The pair of leads hover above the substrate to separate an electrical route of the LED assembly from a heat conducting pathway thereof. Furthermore, each LED has a plurality of legs extending radially from the base thereof to fit in the base of an adjacent LED, to thereby engagingly lock with the adjacent LED.

18 Claims, 24 Drawing Sheets

US 7,795,628 B2

LED ASSEMBLY WITH SEPARATED THERMAL AND ELECTRICAL STRUCTURES THEREOF

BACKGROUND OF THE INVENTION

1. Field of the Invention

The present invention relates to a light emitting diode (LED) assembly, and more particularly to an LED assembly having separated thermal and electrical structures for ensuring a constant lighting brightness and a long lifetime thereof.

2. Description of Related Art

LED have been available since the early 1960's. Because of the relatively high efficiency of LEDs, nowadays LED usage has been increased in popularity in a variety of applications, e.g., residential, traffic, commercial, industrial settings. However, when the LED is in operation, it generates a great deal of heat, which may result in the LED overheating or even malfunction if the heat cannot be dissipated timely. Therefore, many attempts are tried in order to effectively cool the LED.

U.S. Pat. No. 6,561,680 B1 discloses a type of LED assembly, which comprises a metal substrate and an LED attached on the substrate (see FIG. 1B of U.S. Pat. No. 6,561,680 B1). The LED has an anode portion and a cathode portion electrically connecting an LED die to a power source to forward a current into the LED die. The anode portion and the cathode portion also thermally contact the substrate in order to dissipate heat from the LED die. When the LED is working, the current is carried to the LED die via the cathode and anode portions from the substrate; simultaneously, the heat generated by the LED die is also transferred to the substrate by the cathode and anode portions, thereby to ensure that a temperature of the LED die is controlled within its normal range.

Nonetheless, there is a problem in this type of LED assembly: since both of the current flux and the heat flux are transferred via the anode and the cathode portions and the substrate, a current transferring pathway of the LED assembly substantially overlaps a heat conducting pathway thereof; thus, the current is easily influenced by the heat. As the temperature of the anode and the cathode portions reaches a high level, the influence of the heat acting on the current becomes significant and results in the current flowing through the anode and cathode portions unstable and fluctuating. The unstable current renders the light emitted from the LEDs flickering, whereby an illumination provided by the LED assembly deteriorates. Furthermore, this unstable current input into the LED may significantly lower a lifetime of the LED; thus, this type of conventional LED assembly cannot be utilized for a sufficiently long period of time.

What is needed, therefore, is an LED assembly which can overcome the above-mentioned disadvantages.

SUMMARY OF THE INVENTION

An LED assembly includes a substrate and a plurality of LEDs mounted on the substrate. Each LED comprises an LED die, a base supporting the LED die thereon and thermally contacting the substrate to transfer heat generated by the LED die to the substrate, a pair of leads electrically connecting the LED die to supply a current to the LED die, and an encapsulant enveloping the LED die therein. The pair of leads extends above the substrate so that an electrical route of the LED assembly is separated from a heat conducting pathway thereof. Thus, during operation of the LEDs, the heat generated by the LED die has only a little influence at the power supplied to the LED die. Accordingly, a steady current can be supplied to the LED die, a good illumination of the LED assembly can be achieved and a life span of the LEDs can be extended. Furthermore, each LED has a plurality of legs extending radially from the base thereof to fit in the base of an adjacent LED, to thereby engagingly combine the plurality of LEDs together.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
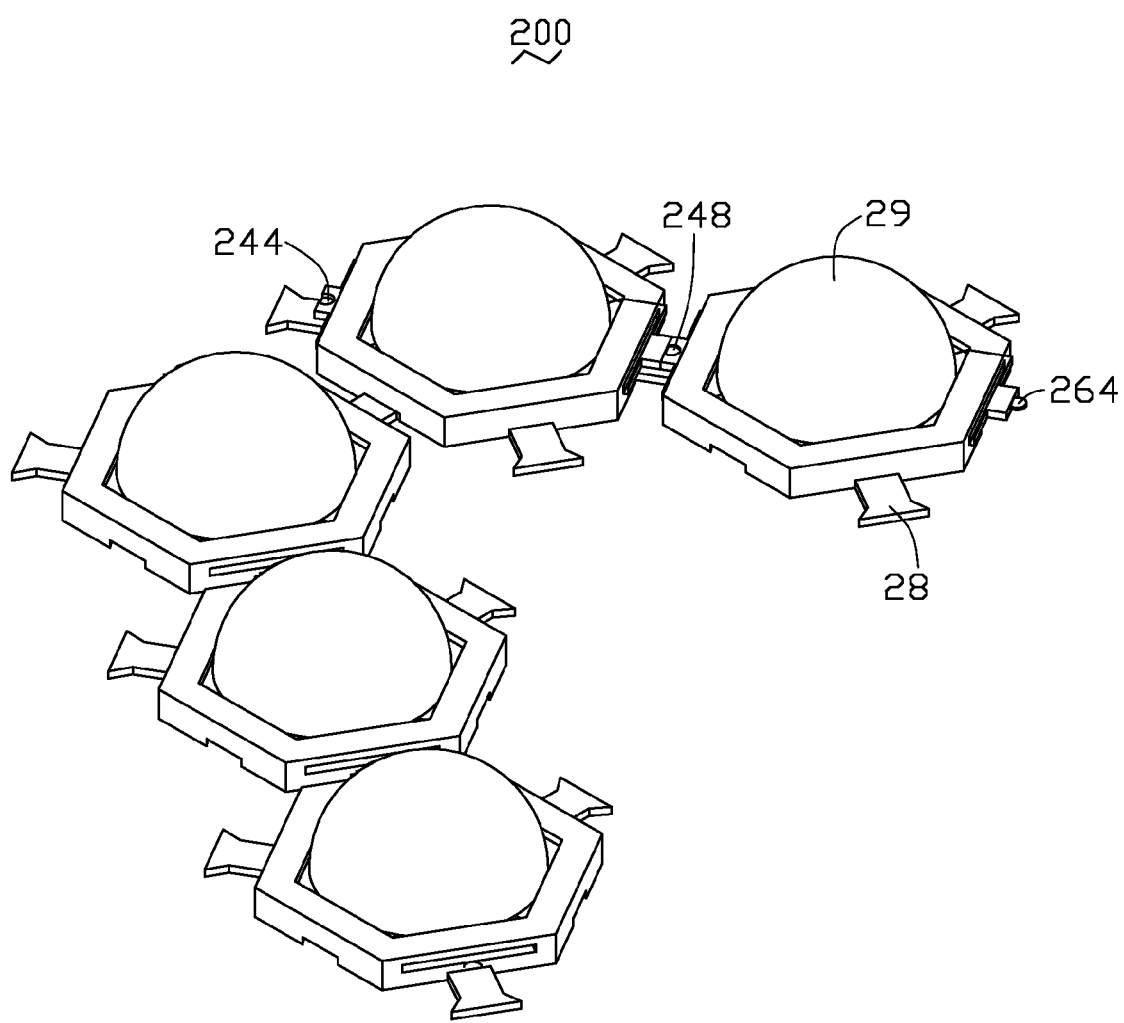
FIG. 1 is an assembled, isometric view of an LED unit of an LED assembly in accordance with a first embodiment of the present invention.
Figure 2:
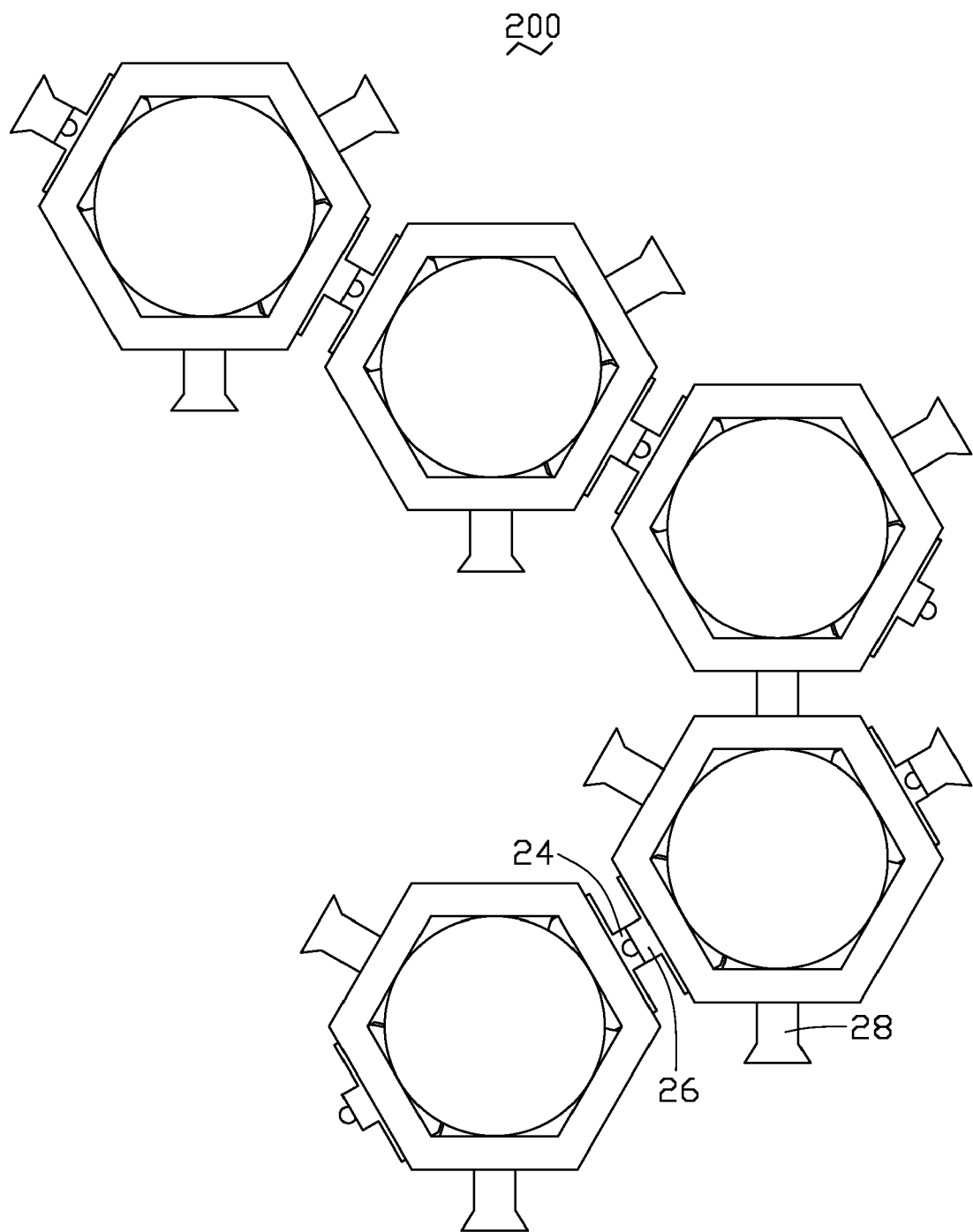
FIG. 2 is a top view of FIG. 1.
Figure 3:
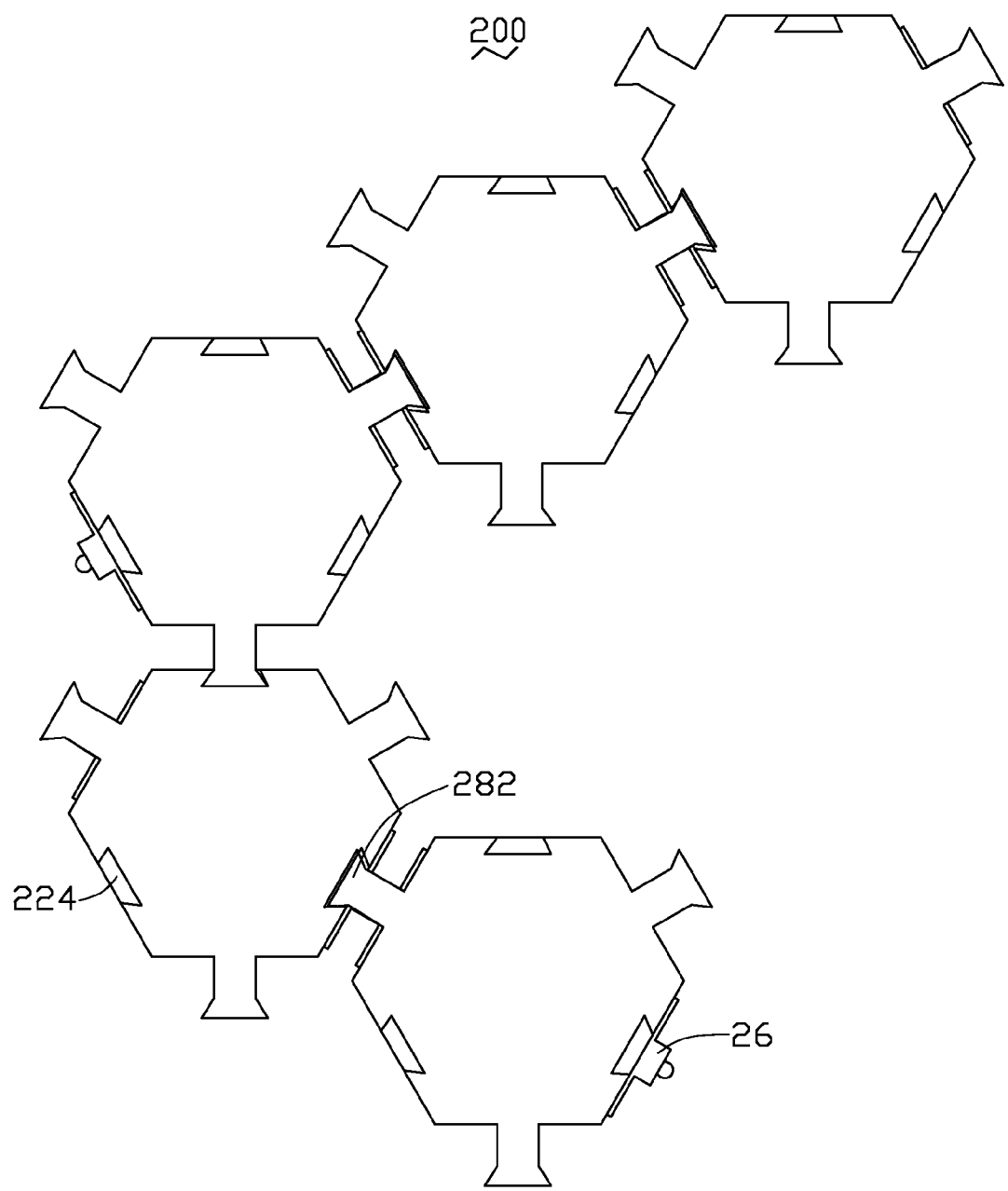
FIG. 3 is a bottom view of FIG. 1.
Figure 4:
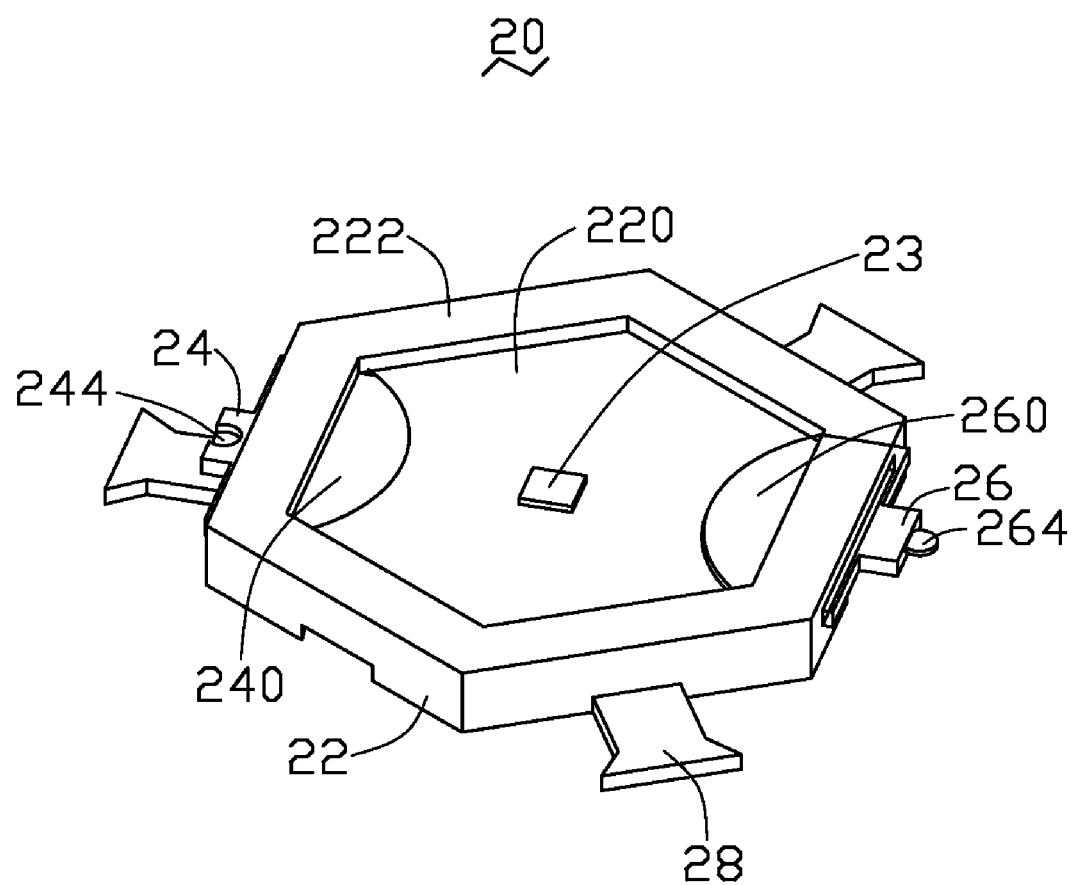
FIG. 4 is an enlarged, perspective view of an LED of the LED unit of FIG. 1, wherein an encapsulant of the LED is removed for clarity.
Figure 5:
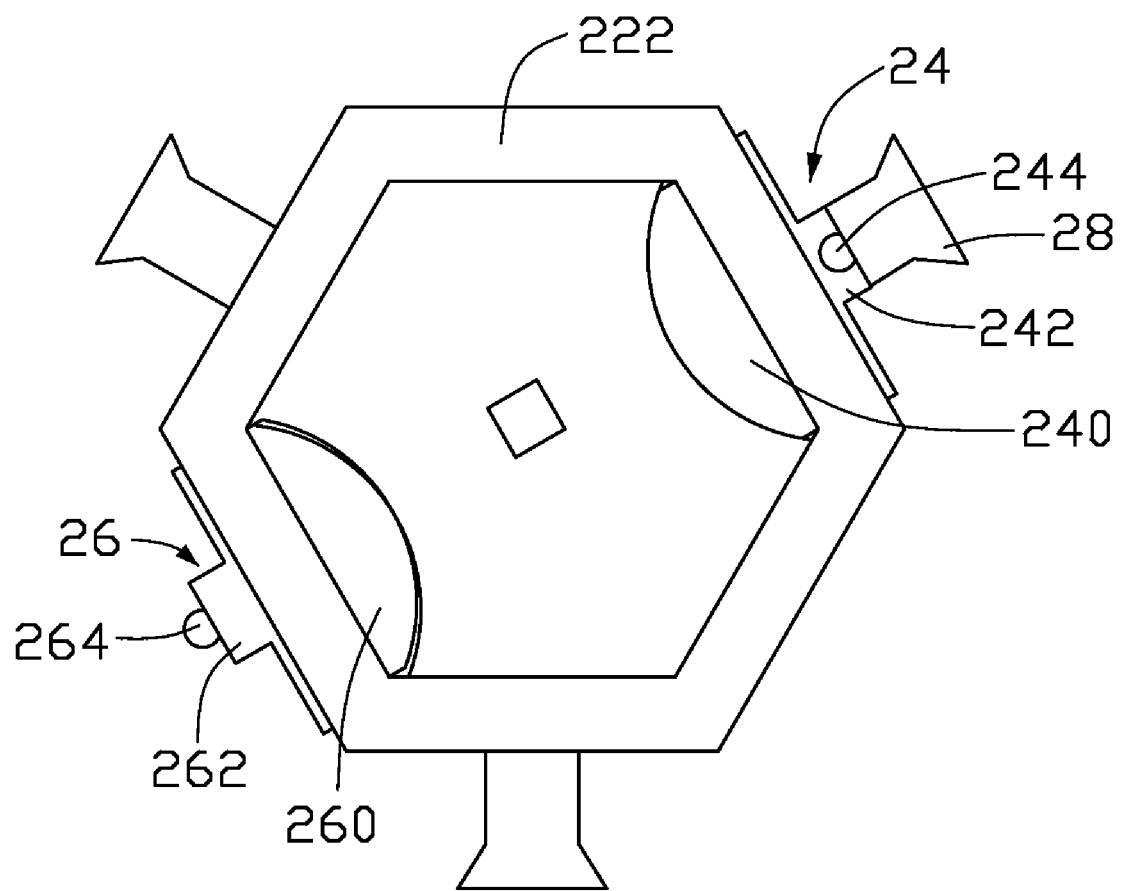
FIG. 5 is a top view of FIG. 4.
Figure 6:
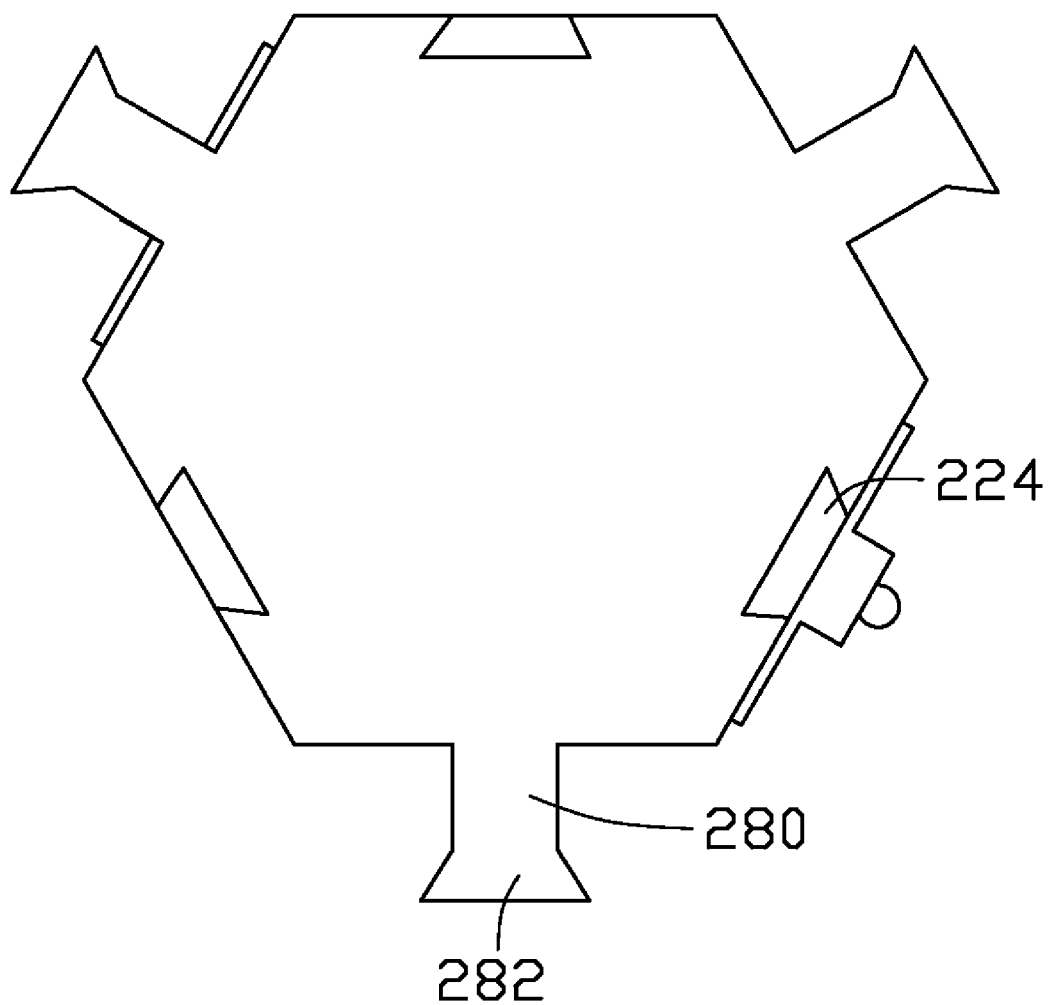
FIG. 6 is a bottom view of FIG. 4.
Figure 7:
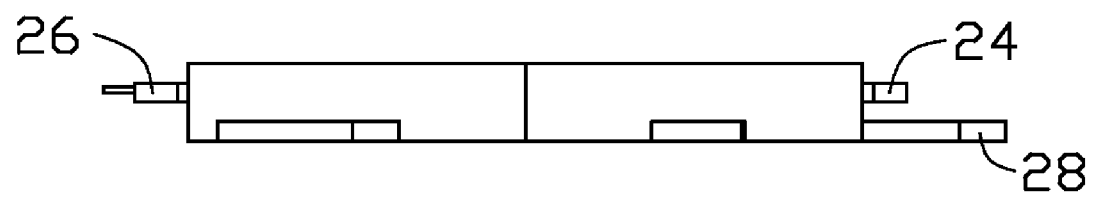
FIG. 7 is a side view of FIG. 4.
Figure 8:
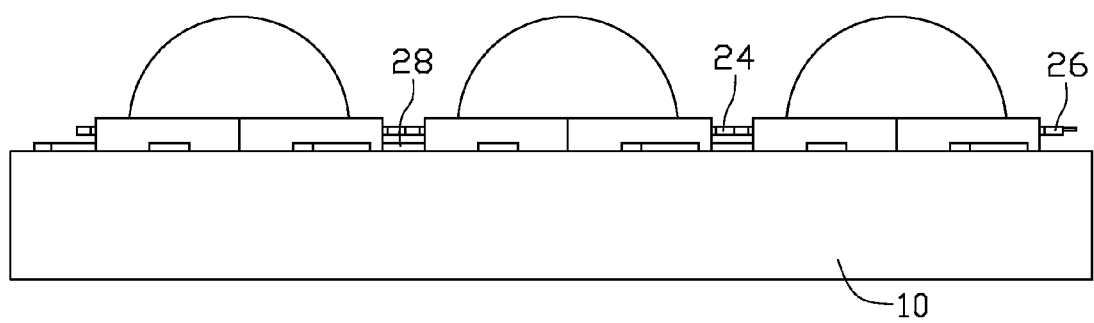
FIG. 8 is a side view of FIG. 1 with a substrate of the LED assembly placed below the LED unit.

Referring to FIGS. 1 and 8, an LED assembly in accordance with a first embodiment of the present invention comprises a substrate 10 and an LED unit 200 mounted on the substrate 10.

The substrate 10 is solid and entirely made of metal, such as copper, aluminum or an alloy thereof. The substrate 10 has a large and flat top surface for mounting the LED unit 200 thereon.

Also referring to FIGS. 4-7, the LED unit 200 is constructed by soldering a plurality of LEDs 20 together. Each LED 20 comprises a hexagonal base 22 defining a hexagonal cavity 220 therein, an LED die 23 adhesively attached in the cavity 220, a first electrode lead 24 and a second electrode lead 26 extending into the base 22 and electrically coupled to the LED die 23 via bonding wires (not shown), three legs 28 extending radially and outwardly from the base 22, and a hemispherical encapsulant 29 (see FIG. 1) encapsulating the LED die 23 therein. The base 22 is made of a material having a good heat conducting and electrically insulating capability, which is well known by those skilled in the related art, such as ceramic. The base 22 is in direct thermal contact with the top surface of the substrate 10 to direct heat generated by the LED die 23 to the substrate 10. The cavity 220 is defined in a central area of a top face of the base 22, being concentric with the base 22. A hexagonal ring-shaped step 222 is formed between the cavity 220 and a circumferential periphery of the base 22. The cavity 220 is used for receiving the LED die 23 therein, and retaining a bottom of the encapsulant 29 as well.

The first and second leads 24, 26 are substantially planar and parallel to the substrate 10; they are extended into the base 22 from two opposite sides of the base 22. Each of the first and second leads 24, 26 comprises a sheet 240, 260 penetrating through the step 222 to be located in the cavity 220, and a block 242, 262 (illustrated in FIG. 5) extending outwardly and horizontally from an extremity end of the sheet 240, 260 to be located outside of a corresponding side of the base 22. The first and second leads 24, 26 are located above the substrate 10 when the LED 20 is mounted on the substrate 10 (see FIG. 8). Each sheet 240, 260 consists of an arced inner part (not labeled) at the bottom of the cavity 220 for electrically connecting to the LED die 23 via the bonding wires, a middle part (not shown) fixedly received in the step 222 to secure the first and second leads 24, 26 in position, and a rectangular outer part (not labeled) extending beyond the step 222 to couple with the block 242, 262. An area of each sheet 240, 260 is far larger than that of each block 242, 262, to thereby enhance a reliability of the electrical connection of the first and second leads 24, 26 with the bonding wires. The block 242 of the first lead 24 forms an approximately circular groove 244 on a top face thereof, while the block 262 of the second lead 26 forms a nearly circular tab 264 projecting outwardly and horizontally from an extremity end thereof. As viewed from FIG. 1, the plurality of LEDs 20 are so electrically connected together that the grooves 244 of the first leads 24 of the LEDs 20 fittingly accommodate the tabs 264 of the second leads 26 of adjacent LEDs 20 therein. Since a current supplied to the LED die 23 travels through the first and second leads 24, 26 hovering above the substrate 10, wherein the substrate 10 is responsible for dissipating heat generated by the LED die 23 from the base 22, a current transferring pathway of the LED assembly is separated from a heat conducting pathway by a clearance between the substrate 10 and the first and second leads 24, 26; thus, an effect of the heat generated by the LED die 23 in influencing the current supplied to the LED die 23 can be reduced to an acceptable range. A depth of the groove 244 of the first lead 24 is slightly larger than a thickness of the tab 264 of the second lead 26, whereby when the tab 264 is retained into the groove 244, a space 248 is formed between a top of the tab 264 and a lateral of the groove 244 (shown in FIG. 1). During soldering of the first and second leads 24, 26 together, the space 248 is capable of receiving excess solder (not shown) therein to prevent the excess solder from overflowing to the substrate 10.

The encapsulant 29 is partially retained into the cavity 220, and projects upwardly in a manner that a size of a cross-section thereof gradually decreases from bottom toward top. The encapsulant 29 envelops the LED die 23 and the inner parts of the sheets 240, 260 of the first and second leads 24, 26 therein, to protect the inner parts of the sheets 240, 260 and the LED die 23 from external influence, e.g., contamination and humidity. The encapsulant 29 is made of a transparent material, such as epoxy, glass, silicone or the like, to guide light emitted by the LED die 23 to radiate out of the LED 20. A fluorescent material (not shown) which is in particulate form, can be dotted in the encapsulant 29, to help the LED 20 to exhibit a certain colorful characteristic, when it is desired.

The three legs 28 are uniformly distributed around the circumferential periphery of the base 22 and located in vicinities of a bottom face of the base 22. The legs 28 are spaced from the first and second leads 24, 26 to avoid direct thermal contact therebetween. Each leg 28 is formed integrally with the base 22 and comprises a rectangular strip 280 and a trapezoidal locking portion 282 extending horizontally and outwardly from the strip 280 (see FIG. 6). Three cutouts 224 are equidistantly designed in the bottom face of the base 22 to alternate with the three legs 28, wherein each cutout 224 is trapezoidal in shape so as to receive the locking portion 282 of a corresponding leg 28 therein, thus engagingly securing adjacent LEDs 20 with each other.

In assembly, the LEDs 20 are fixed to each other to form the LED unit 200; the locking portion 282 of each leg 28 of each LED 20 is accommodated into a corresponding cutout 244 of an adjacent LED 20, and the tab 264 of the second lead 26 of each LED 20 is received in the groove 244 of the first lead 24 of the adjacent LED 20. Then the locking portions 282 of the legs 28 are soldered in the cutouts 224 of the bases 22, whereby the LED unit 200 is securely formed. The LED unit 200 is attached on the substrate 10 to cooperatively construct the LED assembly. At last, the first and second leads 24, 26 are soldered together to electrically connect the plurality of LEDs 20.

With the help of the space 248, during soldering of the first and second leads 24, 26, even if a quantity of the solder offered to the first and second leads 24, 26 exceeds a predetermined amount, the excess portion of the solder would not overflow to contaminate the LED assembly, particularly, the substrate 10. Thus, the top surface of the substrate 10 which supports the LEDs 20 thereon can be kept clean, and the problem caused by the overflowed solder such as a short circuit can be avoided.

In use, when the LED die 23 is activated to lighten, the heat generated by the LED die 23 is conducted to the substrate 10 via the base 22, while the current is conveyed to the LED die 23 through the first and second leads 24, 26. Since the first and second leads 24, 26 are separated from the substrate 10, the pathway through which the current is supplied is separated from the pathway through which the heat is dissipated, the heat would not significantly affect the set value of the current supplied to the LED die 23; thus, the current is capable of being maintained in a relatively steady level. The steadily input current insures the LED die 23 emitting light with a constant intensity; a good illumination of the LED assembly is thus obtained, and a lifetime of the LED assembly is accordingly prolonged.

Alternatively, during assembling, the process of soldering the first and second leads 24, 26 together can be implemented before the LED unit 200 attached on the substrate 10; thus, the LED unit 200 is substantially completed prior to the LED assembly. Since the LED unit 200 has the first and second leads 24, 26 connected with each other to realize electrical connections, and the legs 28 locked with the bases 22 to realize mechanical connections; thus, if the bases 22 of the LED unit 200 can provide sufficient heat dissipation to the LED dies 23, no substrate 10 is needed, and the LED unit 200 can be utilized individually. The LEDs 20 of the individual LED unit 200 can be freely arranged in various patterns according to different demands, without being restricted by a shape or a size of the substrate 10; therefore, a versatility of the LED unit 200 is obtained.

Furthermore, the relationship and the number of the first and second leads 24, 26 and the legs 28 can be changed in accordance with different requirements. For example, the first lead 24 can be located adjacent to the second lead 26, and one of the three legs 28 can be removed for reducing a manufacture cost.

Figure 9:
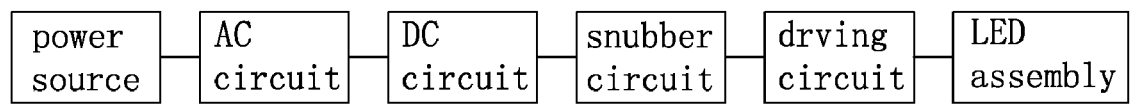
FIG. 9 is a schematic block view of a power supply circuit connected between a power source and the LED assembly, wherein a snubber circuit is connected between a DC circuit and a driving circuit of the power supply circuit.
Figure 10:
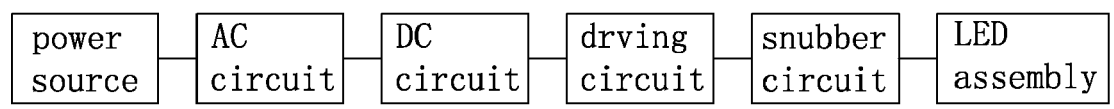
FIG. 10 is a view similar to FIG. 9, but the snubber circuit is positioned between the driving circuit and the LED assembly.

As illustrated in FIG. 9, the LED assembly can be connected to a snubber circuit to protect the LED die 23 from being damaged at the time when initially, electrically connecting the LED assembly to a power source. Conventionally, the LED assembly is sequentially connected to a driving circuit, a direct current (hereinafter is predigested to DC) circuit, an alternating current (hereinafter is predigested to AC) circuit, and a power source (such driving circuit, DC circuit and AC circuit are cooperatively called a power supply circuit). The AC circuit inputs an AC into DC circuit from the power source, the DC circuit converts the AC to a DC, which is then conveyed to the LED assembly via the driving circuit. However, such power supply circuit can only control a current type and a current value, and cannot control a varied range of the current. Following a suddenly, electrically connecting action, the current varies dramatically from zero to a large value in a relatively short time, which input into the LED die 23 from the circuit supply circuit would damage the LED die 23. Therefore, in FIG. 9 of the present invention, the snubber circuit is added between the DC circuit and the driving circuit, to relieve the sharply varied current to a gradually increased current, which smoothly input into the LED assembly would not damage the LED die 23. In operation, as soon as the LED assembly electrically connected, a sharply varied AC is produced and is conveyed to the DC circuit via the AC circuit. The DC circuit converts the sharply varied AC into a sharply varied DC, which is input into the snubber circuit. After passing through the snubber circuit, the sharp variation of the DC is relieved, and the DC becomes gradually increased. The gradually increased DC is then input into the LED assembly via the driving circuit, and enables the LED die 23 to lighten from dark to bright slowly. Therefore, the damage caused by the current to the LED die 23 is prevented. Also, it can be apprehended by those skilled in the related art that such snubber circuit can be connected between the driving circuit and the DC circuit as well, which is shown in FIG. 10.

Figure 11:
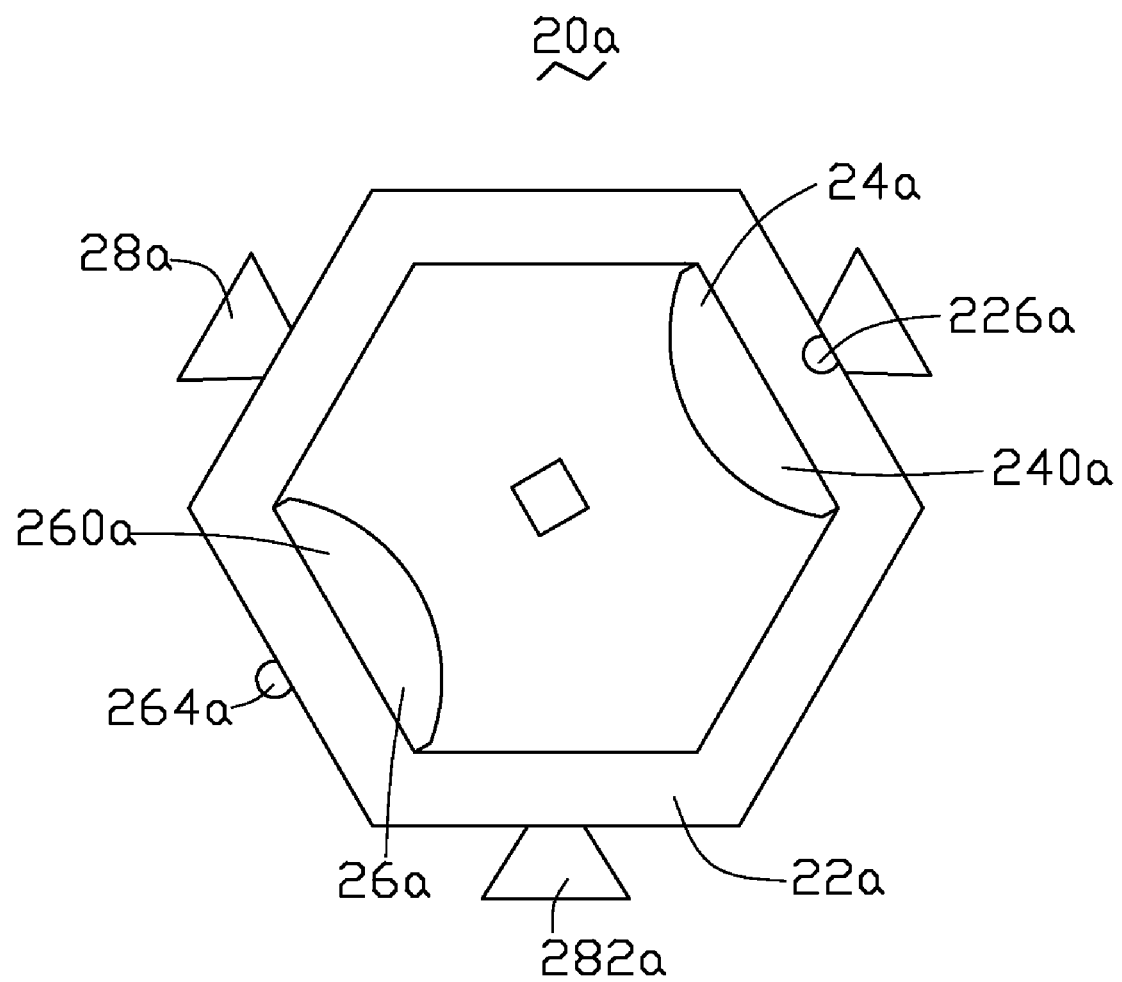
FIG. 11 is a view similar to FIG. 5, showing an LED in accordance with a second embodiment of the present invention, wherein a first lead, a second lead and legs of the LED are shorter than those of the LED of FIG. 5.

A distance between two adjacent LEDs 20 is associated with a length of the strip 280 of the leg 28 and a sum of lengths of respective portions of the first lead 24 and the second lead 26 extending outside the base 22. In order to obtain much more light per area, the LEDs 20 should abut against each other more intimately without the distance existing therebetween, or only a little distance therebetween. FIG. 11 schematically shows a second embodiment of the present invention, in which the configurations of the first and second leads 24a, 26a and the legs 28a are changed so as to hold adjacent LEDs 20a in intimate contact with each other. The first lead 24a of the LED 20a comprises a sheet 240a entirely received in a base 22a. The second lead 26a comprises a sheet 260a accommodated within the base 22a, and a tab 264a extending outwardly beyond the base 22a. For realizing a connection between the first lead 24a and the second lead 26a of two adjacent LEDs 20a, a portion of the base 22a is recessed to form a trough 226a, in which an outmost part of the sheet 240a of the first lead 24a is exposed. Accordingly, each leg 28a only remains a locking portion 282a to be snugly fitted into a corresponding cutout (not shown) in an adjacent base 22a. Since the tab 264a of the second lead 26a of each LED 20a is fully received in the trough 226a of the base 22a of an adjacent LED 20a to electrically connect with the first lead 24a of the adjacent LED 20a, and the leg 28a completely received in the corresponding cutout of the base 22 of the adjacent LED 20a, lateral sides of the two adjacent LEDs 20a are capable of abutting against each other intimately. Thus, LEDs 20a can be arranged in a higher density, and an overall output intensity of the light is accordingly increased. On the other hand, supposed that the light produced per area can meet a lighting intensity requirement, the first and second leads 24, 26 and the legs 28 of the LEDs 20 of the first embodiment only need to be shorten, to avoid redesigning and remanufacturing of the base 22.

Figure 12:
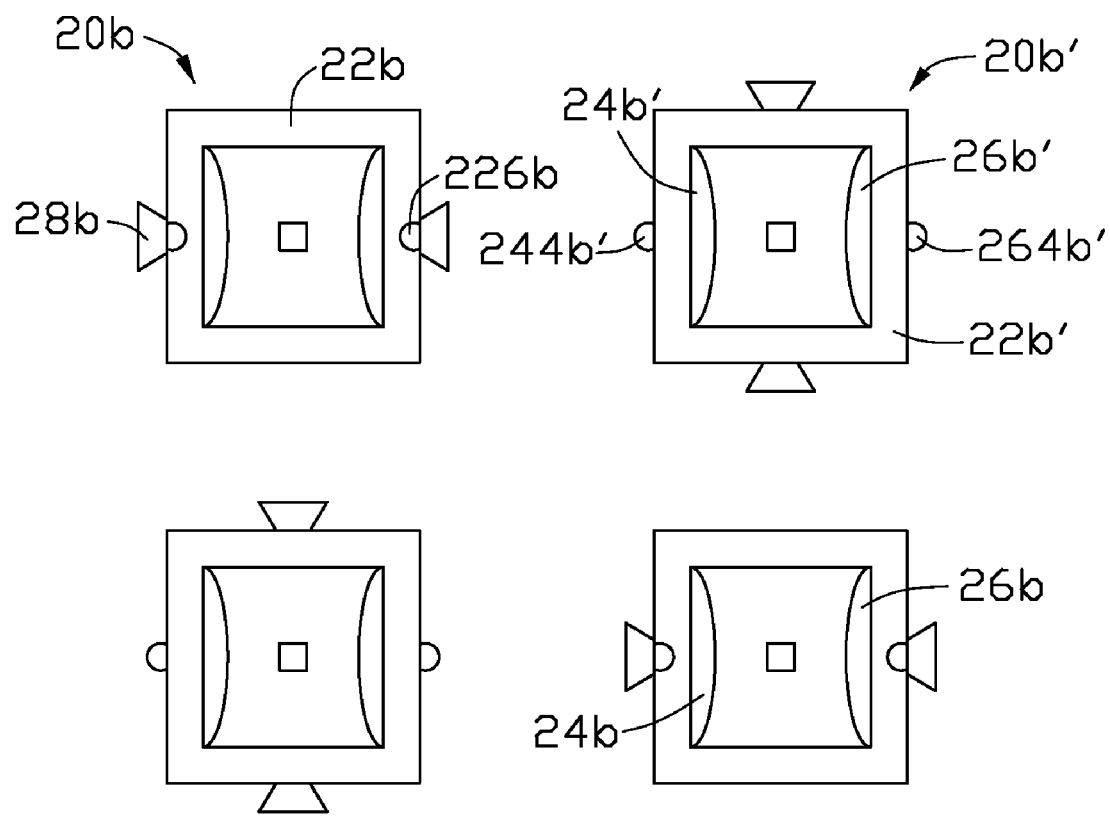
FIG. 12 is a top view of an LED unit in accordance with a third embodiment of the present invention.
Figure 13:
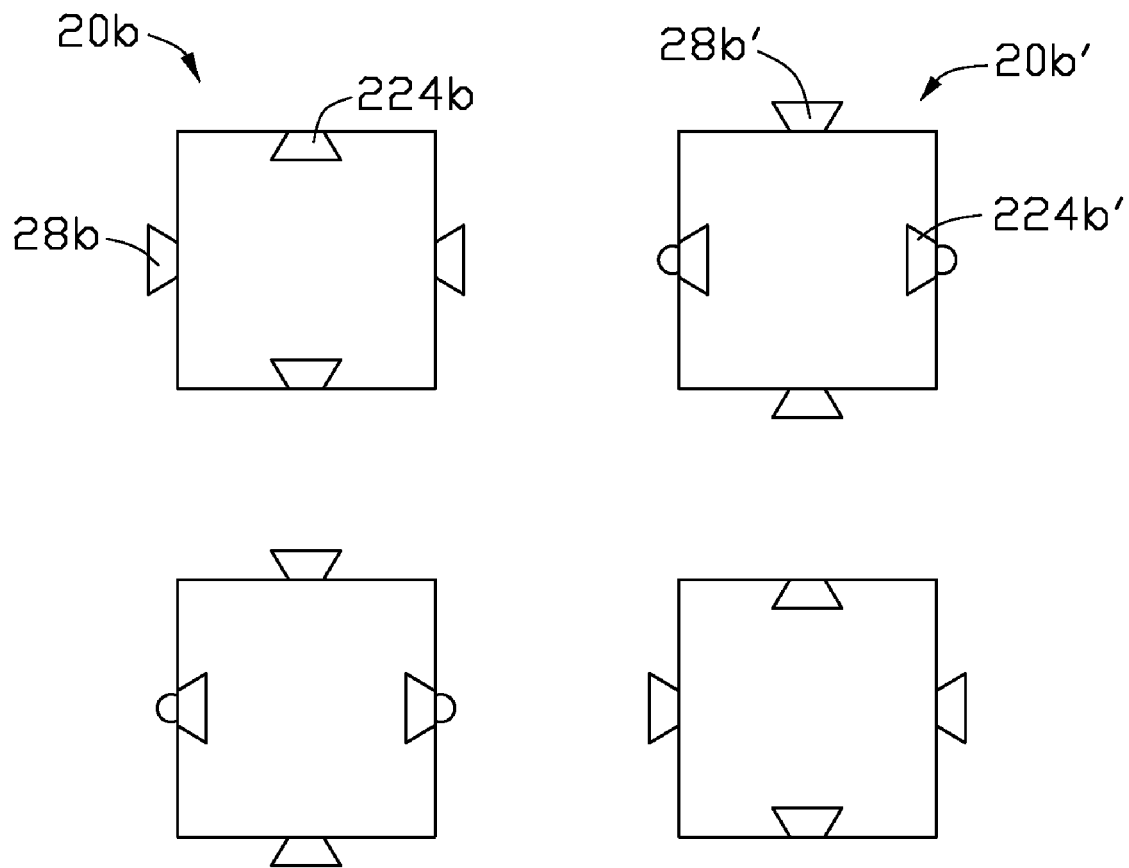
FIG. 13 is a bottom view of FIG. 12.
Figure 14:
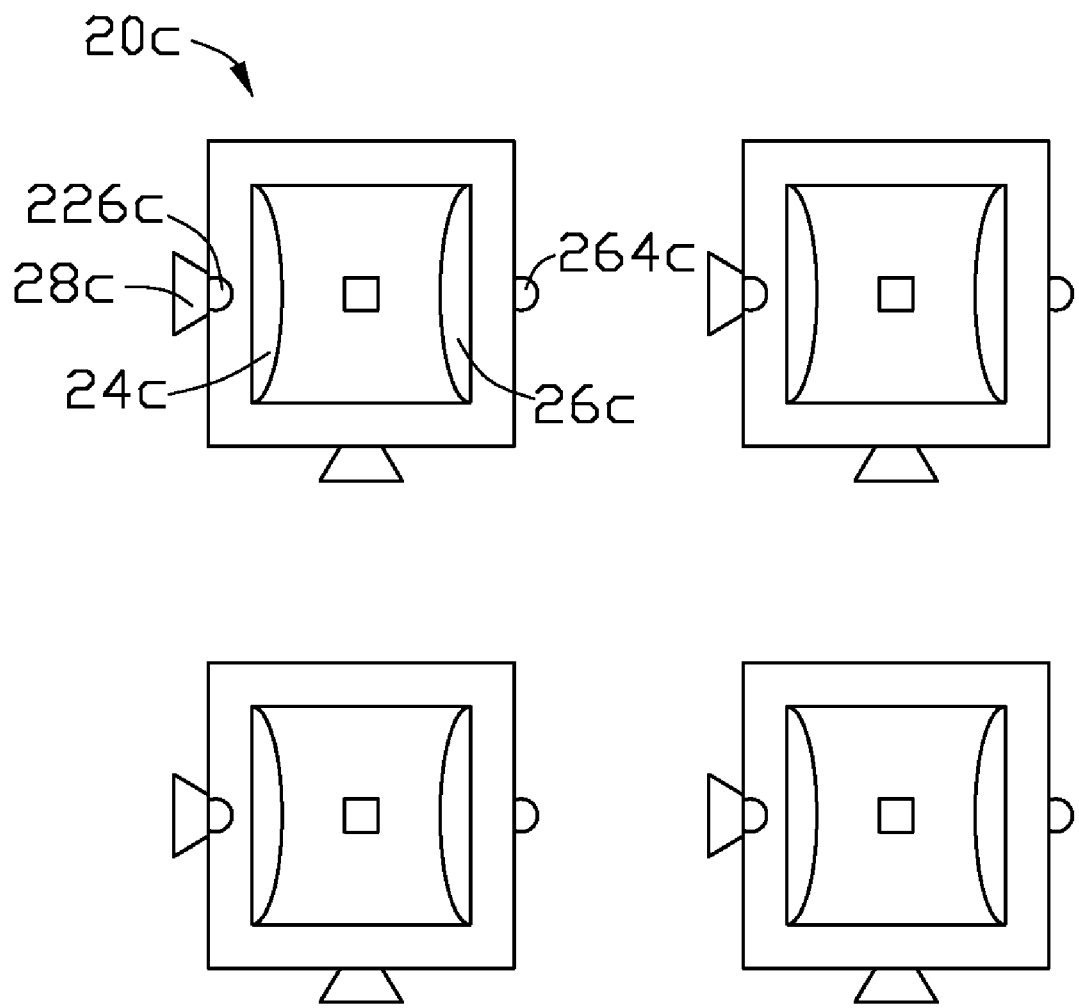
FIG. 14 is a top view of an LED unit in accordance with a forth embodiment of the present invention.
Figure 15:
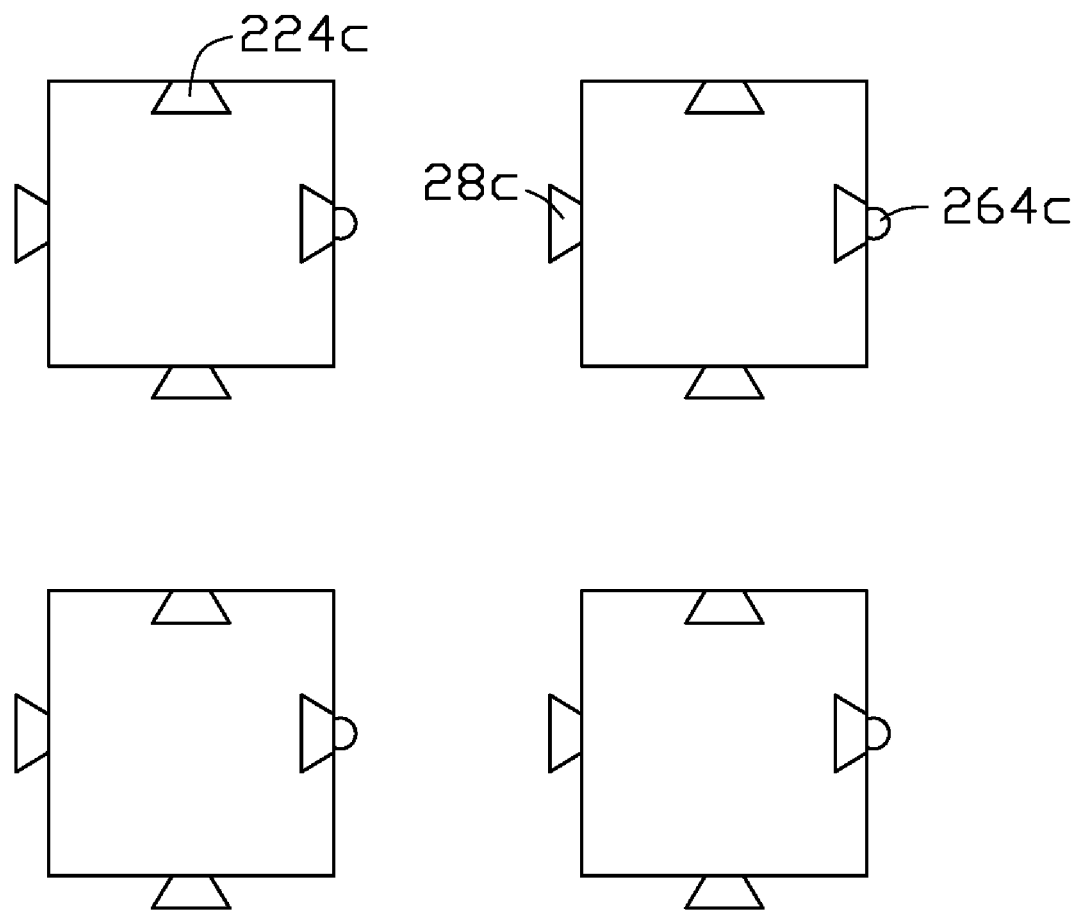
FIG. 15 is a bottom view of FIG. 14.

Note that a shape and a size of the base 20 of the first embodiment can be changed to various types according to different occasions. For example, FIGS. 12-13 illustrate a third embodiment of the present invention, in which the base 22b, 22b' is in the form of a square, and has two legs 28b, 28b' formed from two opposite sides thereof and two cutouts 224b, 224b' defined at other two opposite sides thereof. In this embodiment there are two types of LEDs 20b, 20b': the first type LEDs 20b each have two troughs 226b defined at the two opposite sides of the base 22b to expose outermost parts of a first and second leads 24b, 26b; the second type LEDs 20b' each have two opposite tabs 244b', 246b' projecting outwardly from the first and second leads 24b', 26b' beyond the other two opposite sides of the base 22b'. The tabs 244b', 264b' of the second type LED 20b' are received in the troughs 226b of an adjacent first type LED 20b and contact the first and second leads 24b, 26b of the first type LED 20b, to thereby electrically connect the first type and second type LEDs 20b, 20b' together. The first type LEDs 20b and the second type LEDs 20b' are so locked together that the legs 28b of each first type LED 20b are retained into the cutouts 224b' of two adjacent second type LEDs 20b', and the cutouts 224b of each first type LED 20b receive the legs 28b' of other two adjacent second type LEDs 20b' therein. Such mutual connections of the plurality of LEDs 20b, 20b' can also be characterized in that: the legs 28b of the first type LEDs 20b realize transverse connections, and the legs 28b' of the second type LEDs 20b' realize longitudinal connections. Furthermore, the LEDs 20b, 20b' with square bases 22b, 22b' can also be modified to have different configurations, which are illustrated in FIGS. 14-15 of the forth embodiment of the present invention, for facilitating a uniform design and manufacture of the LEDs 20b, 20b'. As shown in FIGS. 14-15, each LED 20c of the forth embodiment has two legs 28c formed from two adjacent sides of the base 22c, and two cutouts 224c defined at other two adjacent sides of the base 22c. Each LED 20c further forms a tab 264c of a second lead 26c extending outwardly beyond a side of the base 20c, and a trough 226c defined at an opposite side of the base 22c to expose an outmost part of a first lead 24c. The trough 226c receives the tab 264c of an adjacent LED 20c. In assembly, the LEDs 20c mechanically engage with each other by fitting the legs 28c of each LED 20c into corresponding cutouts 224c of two adjacent LEDs 20c, and electrically couple with each other by soldering the tab 264c of each LED 20c in the trough 226c of an adjacent LED 20c. Due to the legs 28c of each LED 20c, both transverse and longitudinal connections of the LEDs 20c can be realized, meanwhile the LEDs 20c have the same configuration and structure.

Figure 16:
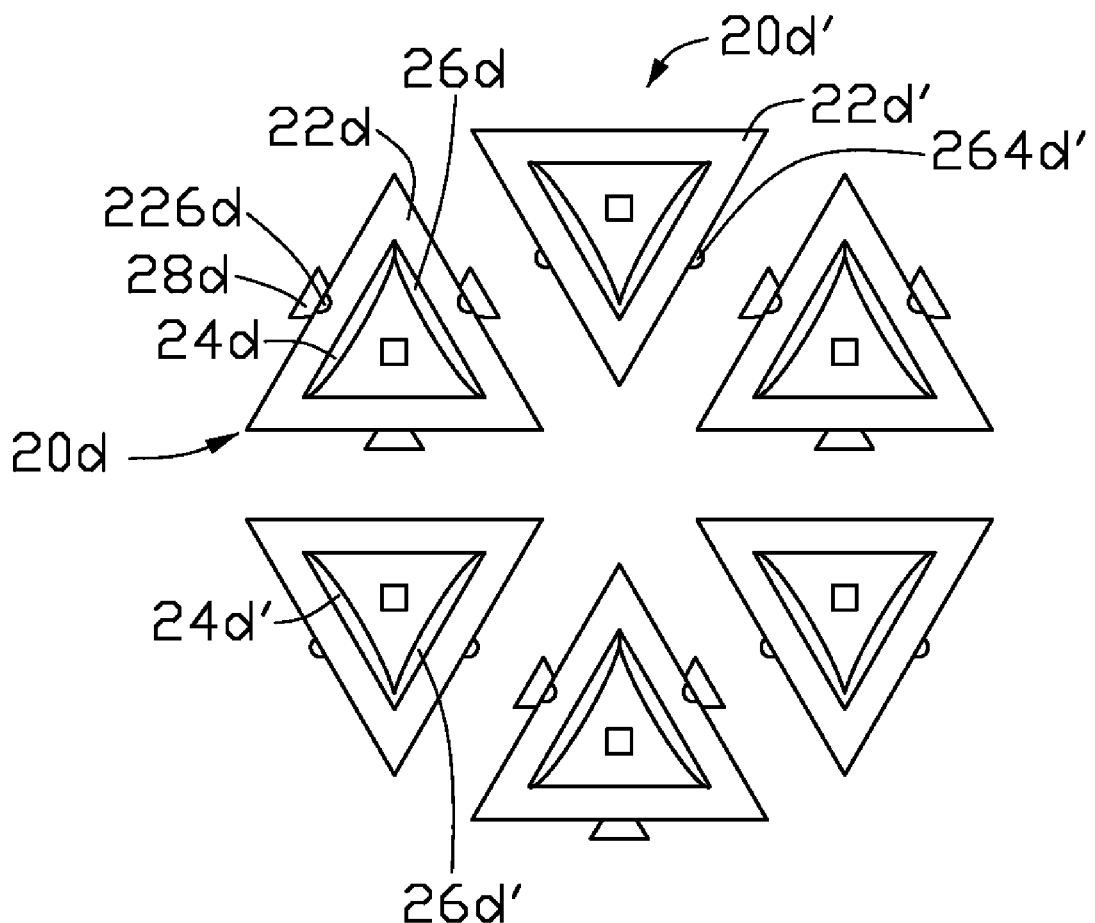
FIG. 16 is a top view of an LED unit in accordance with a fifth embodiment of the present invention.
Figure 17:
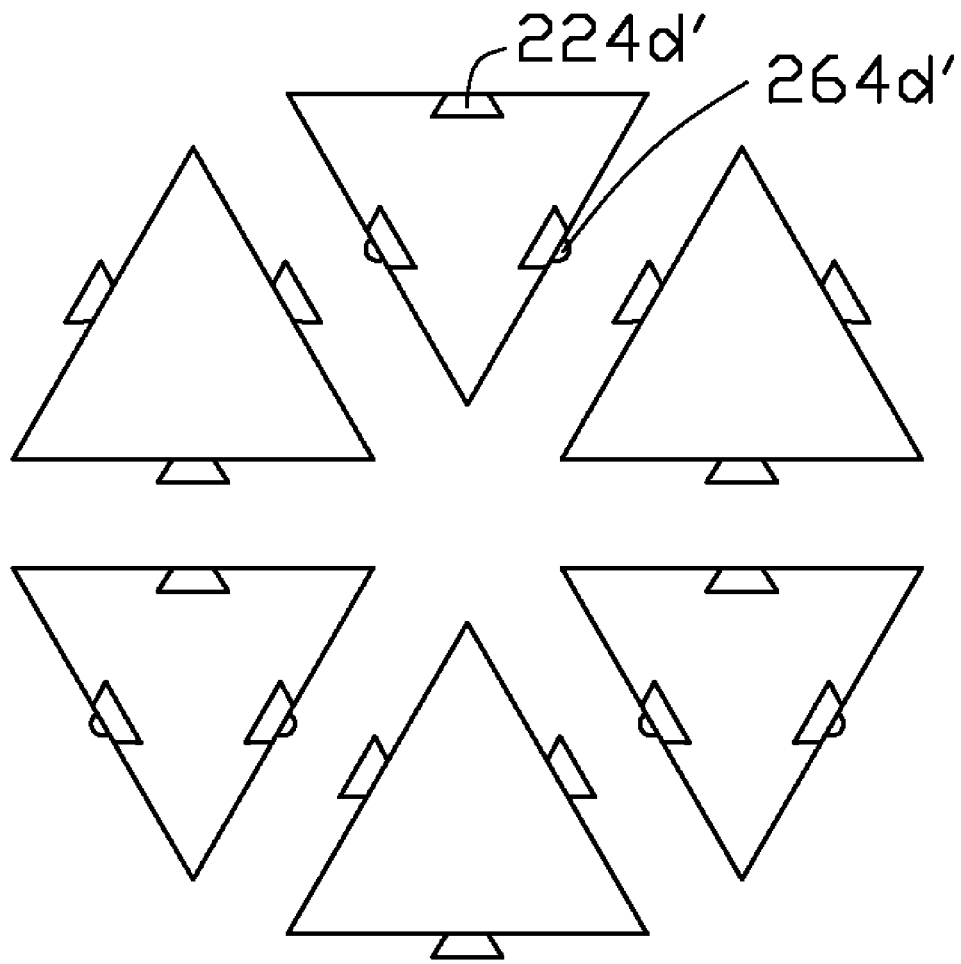
FIG. 17 is a bottom view of FIG. 16.
Figure 18:
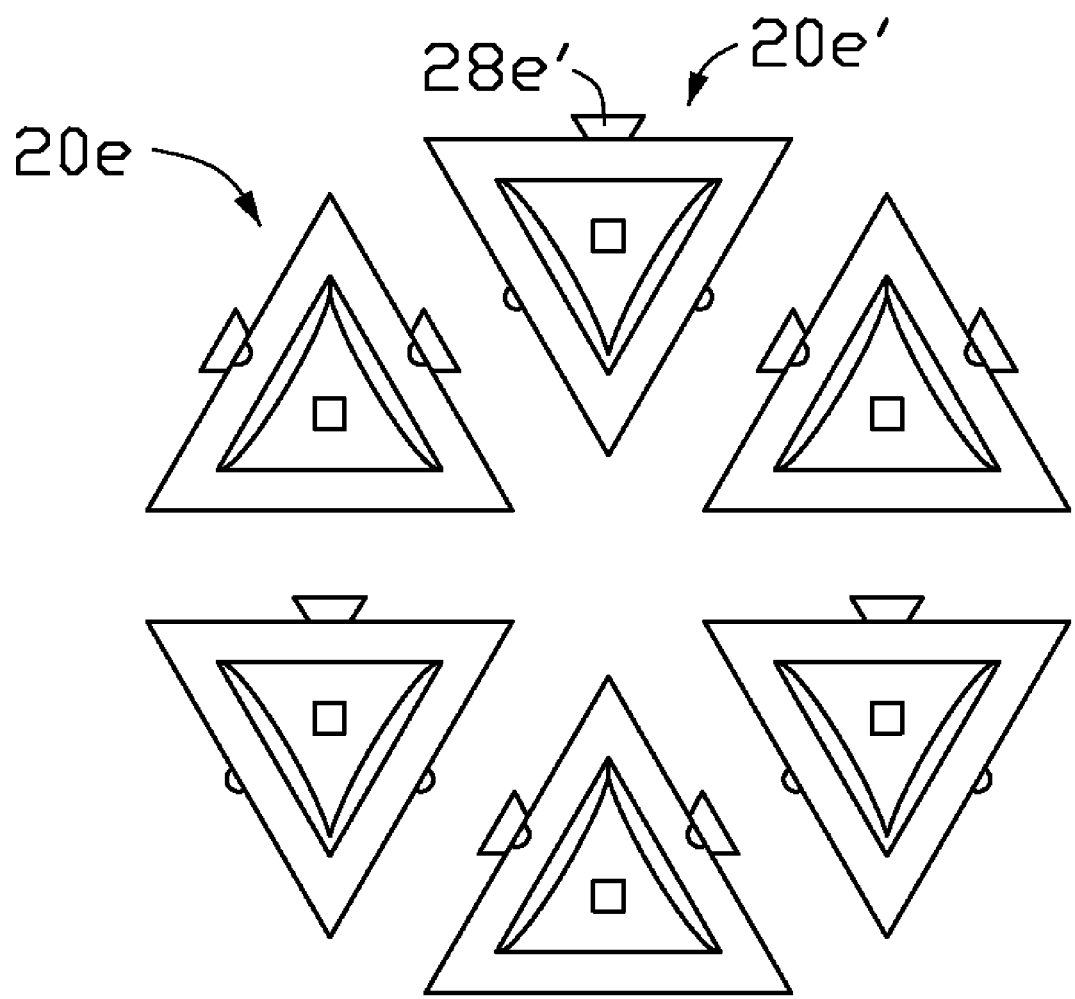
FIG. 18 is a top view of an LED unit in accordance with a sixth embodiment of the present invention.
Figure 19:
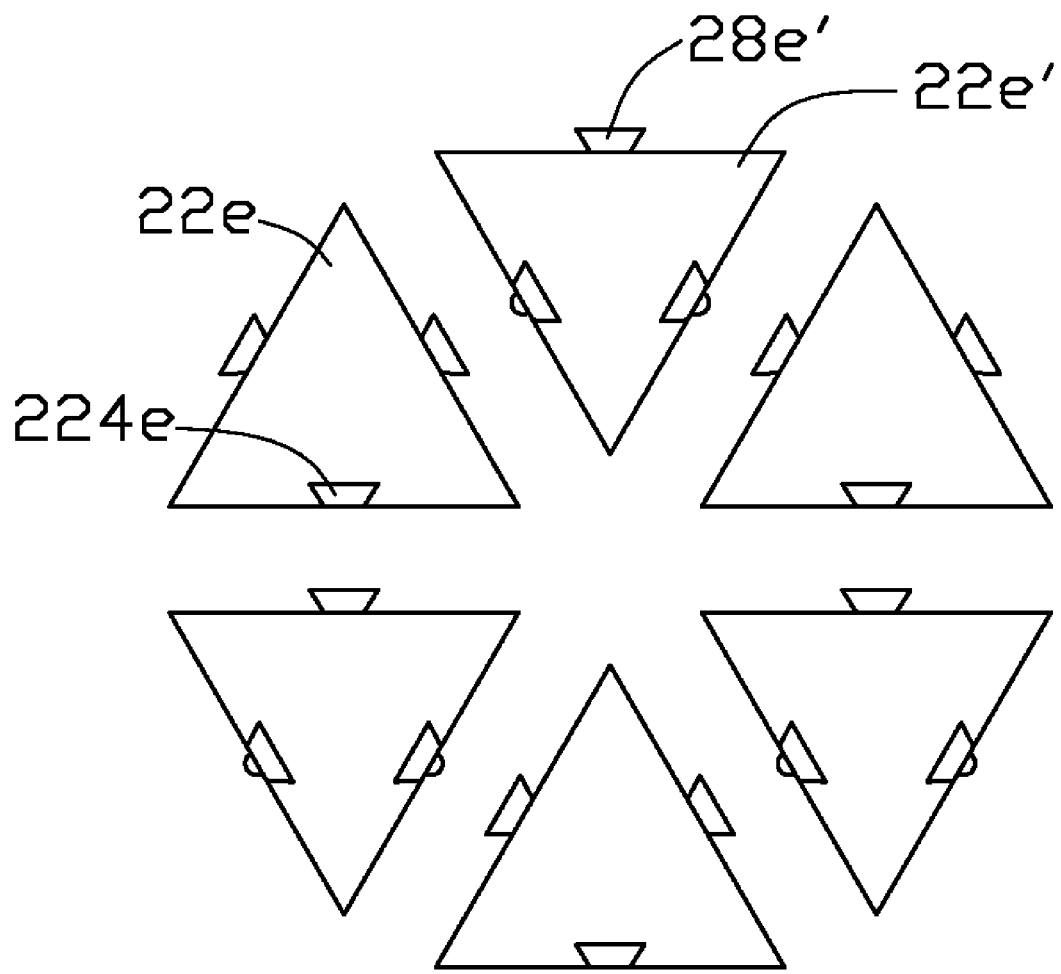
FIG. 19 is a bottom view of FIG. 18.

FIGS. 16-17 show a fifth embodiment of the present invention, in which the base 22d, 22d' is shaped to be triangle. Considering electrical and mechanical connections between the plurality of LEDs 20d, 20d', the LEDs 20d, 20d' should be designed to have two different configurations: a first type LEDs 20d each form three legs 28d respectively extending outwardly from three sides of the base 22d, and define two troughs 226d at two sides of the base 22d to expose outmost parts of a first lead 24d and a second lead 26d thereof; a second type LEDs 20d' each define three cutouts 224d' around a periphery of the base 22d' corresponding to the three legs 28d, and have two tabs 264d' extending outwardly from first and second leads 24d', 26d' beyond two sides of the base 22d'. In assembly, the three legs 28d of each first type LED 20d are respectively engaged in corresponding three cutouts 224d' of three adjacent second type LEDs 20d', and the two troughs 226d respectively accommodate two corresponding tabs 264d' of two adjacent second type LEDs 20d' therein. In this embodiment, the first type LED 20d acts as an active mechanical connector, and the second type LED 20d' is employed as a passive mechanical connector. Alternatively, one leg 28d of the first type LED 20d can be moved to the second type LED 20d', whereby each of the first type LED 20d and the second type LED 20d' acts as the active mechanical connector. Such variations of the legs 28d, 28d' between the first type LED 20d and the second type LED 20d' are shown in FIGS. 18-19 in accordance with a sixth embodiment of the present invention. A first type LED 20e forms a cutout 224e in a bottom of a base 22e at a location where the original leg 28d of the fifth embodiment is formed. Accordingly, a second type LED 20e' forms a leg 28e' at a location where the original cutout 224d' of the fifth embodiment is defined.

Figure 20:
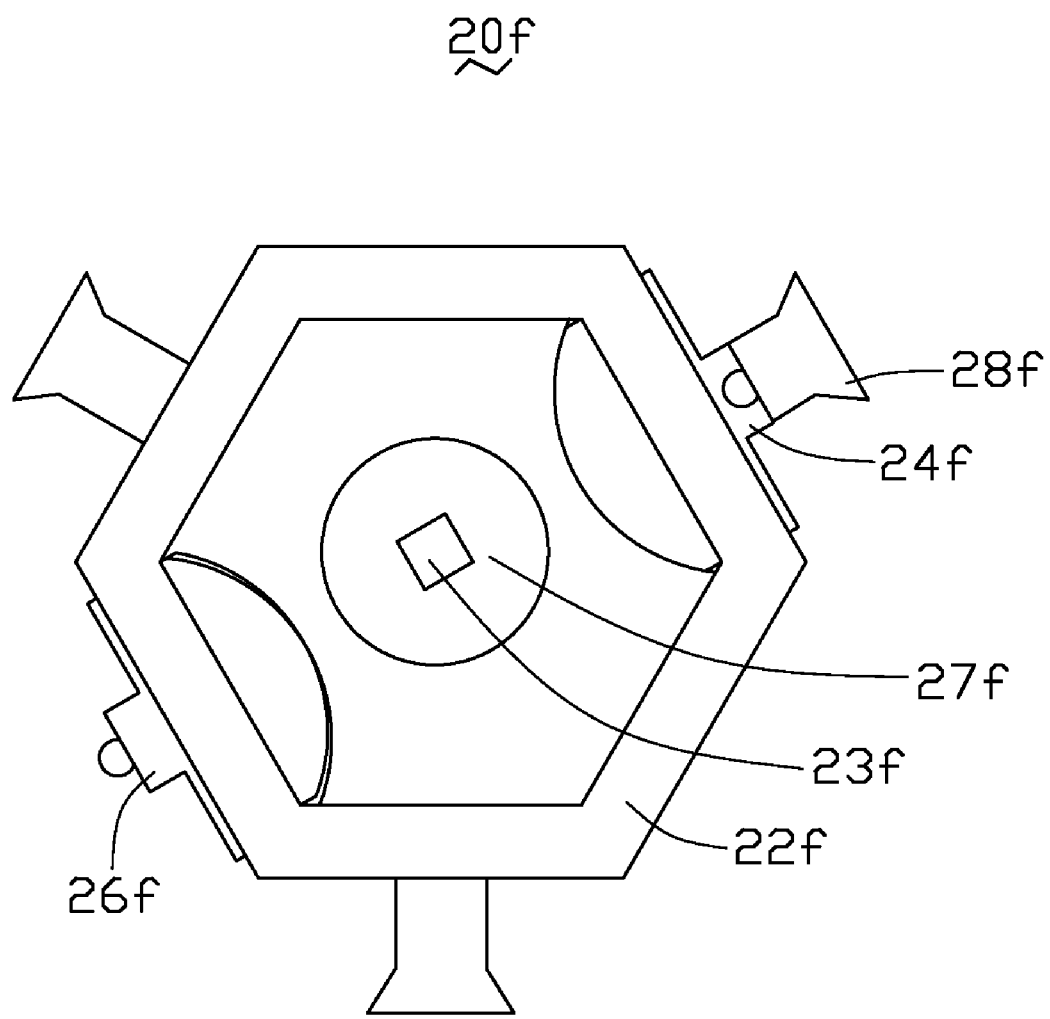
FIG. 20 is a top view of an LED in accordance with a seventh embodiment of the present invention.
Figure 21:
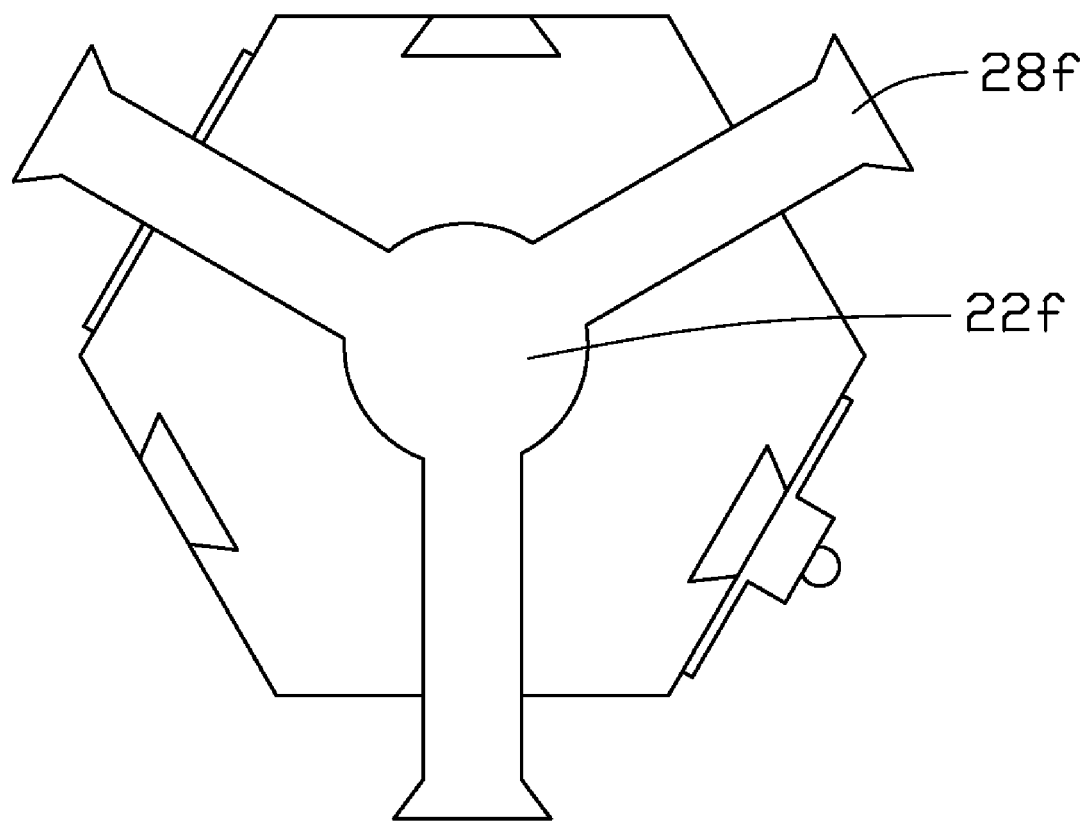
FIG. 21 is a bottom view of FIG. 20.

Furthermore, the base 22 of the first embodiment can be modified to another structure which is shown in FIGS. 20-21 in accordance with a seventh embodiment of the present invention. The differences of the seventh embodiment relative to the first embodiment are given below.

The base 22f of the LED 20f of the seventh embodiment is made of a thermally isolating and electrically insulating material such as epoxy, plastic and so on. A through hole (not labeled) is defined in a center of the base 22f of the LED 20f. Three channels (not labeled) are radially formed in a bottom of the base 22f, communicating with the through hole. A metal structure (not labeled), which is integrally formed by a post 27f and three legs 28f, is filled in the through hole and the three channels, and separated from the first lead 24f and the second lead 26f by the base 22f. Each leg 28f has an interior portion (not labeled) retained in a corresponding channel and coupling with a circumferential periphery of the post 27f, and an exterior portion (not labeled) extending outside the base 22f for locking with an adjacent LED 20f. The post 27f, the legs 28f and the base 22f contact the substrate 10 by bottoms thereof engaging with the top surface of the substrate 10. An LED die 23f is fixed on a top of the post 27f via a thermally conducting grease or glue. By using this construction, nearly all of heat generated by the LED die 23f is conducted to the substrate 10 via the post 27f and the legs 28f, while a current given to the LED die 23f is conveyed through a first and second leads 24f, 26f which are spaced from the post 27f and the legs 28f by the base 22f; thus, a current conducting pathway of the LED assembly and a heat conducting pathway thereof are substantially separated from each other, and the current can be maintained in a steady state without being affected by the heat. Note that all of other components in this embodiment are the same as those described in the first embodiment.

Figure 22:
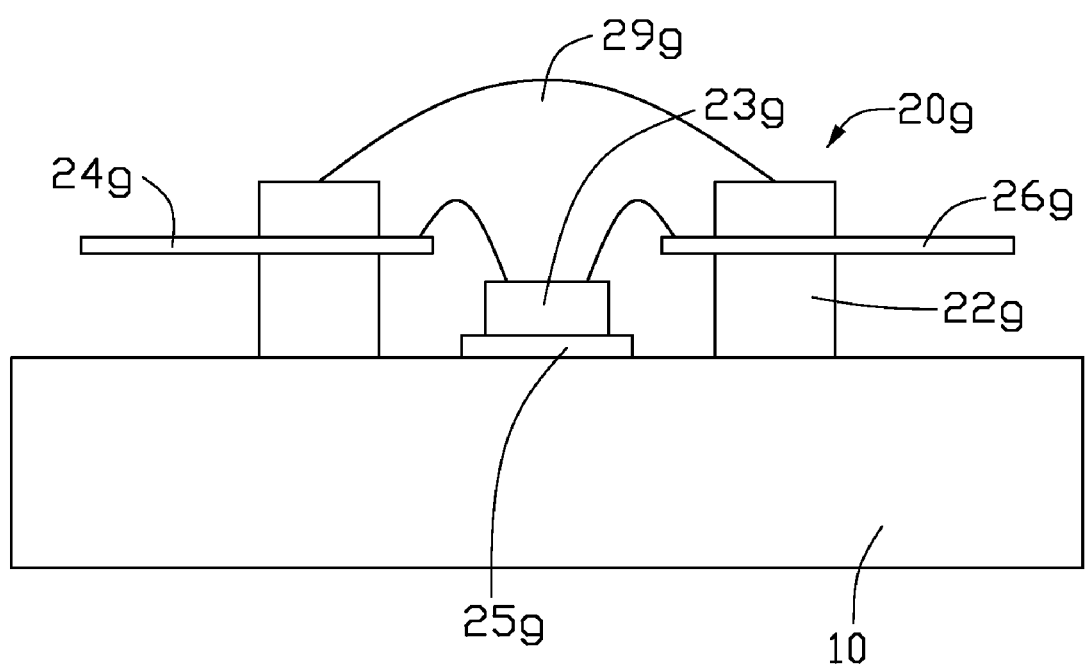
FIG. 22 is a cross-sectional view of an LED assembly in accordance with an eighth embodiment of the present invention.
Figure 23:
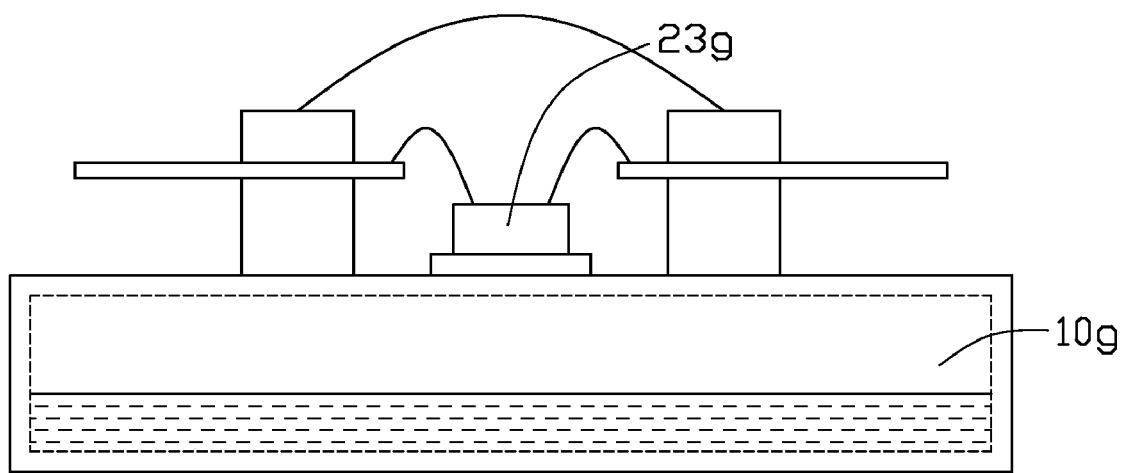
FIG. 23 is a view similar to FIG. 22, wherein a substrate of the LED assembly contains a coolant therein.

Referring to FIG. 22, which shows an LED assembly in accordance with an eighth embodiment of the present invention. In order to conduct heat generated by an LED die 23g to the substrate 10 more rapidly, a portion of a base 22g placed between the LED die 23g and the substrate 10 is omitted, while the LED die 23 is directly bonded on the top face of the substrate 10 via a kind of heat conducting adhesive 25g. Preferably, a thickness of the heat conducting adhesive 25g is selected to be less than 0.01 inches, for obtaining a balance between a good heat conducting capability and a sufficient gluing force. The base 22g of each LED 20g is annular to spacedly surround the LED die 23g. A first lead 24g and a second lead 26g are respectively inserted into the base 22g with inner parts (not labeled) thereof being exposed and outer parts (not labeled) thereof hovering above the substrate 10. The LED die 23g is electrically connected to the first and second leads 24g, 26g via golden wires (not labeled). An encapsulant 29g envelops the LED die 23g and the inner parts of the first and second leads 24g, 26g therein to protect the LED die 23g from contamination and damage. Referring to FIG. 23, for more efficiently deriving heat from the LED die 23g, such solid metal substrate 10 can be replaced by a hollow substrate 10g which transfers heat by using a phase change of working fluid. The substrate 10g can be a flat vapor chamber or a heat pipe. The substrate 10g can further connect with a heat sink (not shown) to disperse heat absorbed thereby to atmosphere, whereby the heat can be dissipated timely and sufficiently because of a large heat dissipating area of the heat sink.

Figure 24:
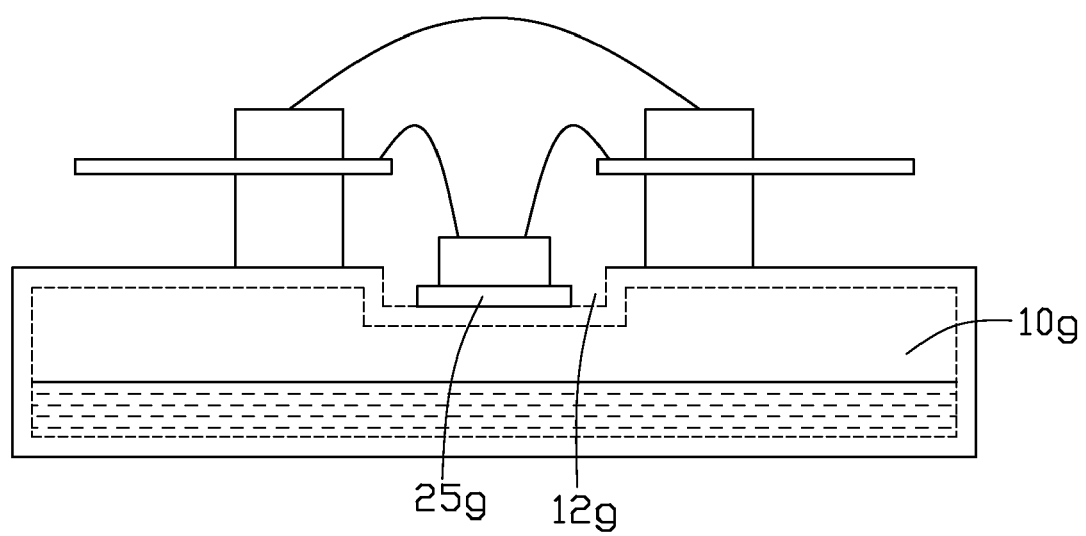
FIG. 24 is a view similar to FIG. 23 with a part of the substrate stamped to form a concave.

As viewed from FIG. 24, furthermore, the substrate 10g can be stamped to form a plurality of concaves 12g (only one shown) at spots where the LED dies 23g are mounted, whereby the LED dies 23g can be accurately positioned at predetermined locations of the substrate 10g. On the other hand, such concave 12g is able to contain the adhesive 25g therein for preventing the adhesive 25g from overflowing to other parts of the substrate 10g.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. An LED assembly comprising:
a substrate;
a plurality of LEDs mounted on the substrate, each of the plurality of LEDs comprising:
a base thermally contacting the substrate;
an LED die mounted on the base;
a first lead and a second lead extending outwardly through the base and electrically connecting the LED die; and
an encapsulant encapsulating the LED die;

wherein a pathway providing a current to the LED die via the first lead and the second lead is separated from a pathway conducting heat from the LED die to the substrate via the base; and wherein the first lead of the each of the plurality of LEDs is directly connected to the second lead of an adjacent one of the plurality of LEDs, the second lead of the each of the plurality of LEDs is directly connected to the first lead of another adjacent one of the plurality of LEDs.

2. The LED assembly as described in claim 1, wherein the first lead and the second lead are substantially parallel to the substrate.

3. The LED assembly as described in claim 1, wherein the first lead and the second lead hover above the substrate.

4. The LED assembly as described in claim 1, wherein the each of the plurality of LEDs comprises a plurality of legs extending radially from a periphery of the base, the plurality of LEDs being fixedly engaged with each other by the plurality of legs.

5. The LED assembly as described in claim 4, wherein the first lead and the second lead are separated from the plurality of legs.

6. The LED assembly as described in claim 4, wherein the base is made of a kind of material having a good heat conducting and electrically insulating capability.

7. The LED assembly as described in claim 6, wherein the plurality of legs is made of a material identical to that of the base, the base and the plurality of legs cooperatively directing the heat from the LED die to the substrate.

8. The LED assembly as described in claim 4, wherein the each of the plurality of LEDs further comprises a heat conducting post inserted into the base to be in thermal contact with the substrate, the LED die being mounted on the post.

9. The LED assembly as described in claim 8, wherein the base is made of a thermally isolating and electrically insulating material, the post being separated from the first lead and the second lead via the base.

10. The LED assembly as described in claim 9, wherein the plurality of legs is directly coupled to the post, the plurality of legs and the post cooperatively conducting the heat from the LED die to the substrate.

11. An LED assembly comprising:
a substrate;
a plurality of LEDs mounted on the substrate, each of the plurality of LEDs comprising:
an LED die being in thermal contact with the substrate so that heat generated therefrom is transferred to the substrate;
a pair of leads electrically coupling with the LED die to supply a current to the LED die; and
a body enveloping the LED die and inner parts of the pair of leads therein;
wherein the pair of leads are spaced from the substrate; and
wherein the each of plurality of LEDs forms a plurality of legs around the base, the plurality of LEDs being locked with each other via the plurality of legs.

12. The LED assembly as claimed in claim 11, wherein outer parts of the pair of leads hover above the substrate.

13. The LED assembly as claimed in claim 12, wherein the body comprises a base supporting the pair of leads above the substrate, and an encapsulant enclosing the LED die.

14. The LED assembly as claimed in claim 13, wherein the LED die is bonded on the substrate via adhesive, the base surrounding and being spaced from the LED die.

15. The LED assembly as claimed in claim 13, wherein the base is disposed between the LED die and the substrate to conduct heat from the LED die to the substrate via a central portion thereof.

16. An LED assembly comprising:
a heat conductive substrate;
a plurality of LEDs mounted on the substrate, each LED having a thermally conductive and electrically insulating base, an LED die mounted on the base and first and second electrode wires extending through the base to electrically connect with the LED die, wherein the electrode wires are located above and separated from the substrate, and wherein the base of each LED forms locking legs for engaging with the base of an adjacent LED.

17. The LED assembly as claimed in claim 16, wherein the each base has a polygonal shape.

18. The LED assembly as claimed in claim 16, wherein the substrate has a working fluid therein for phase change.

* * * * *